US011152245B2

(12) United States Patent
Park et al.

(10) Patent No.: US 11,152,245 B2
(45) **Date of Patent: *Oct. 19, 2021**

(54) LED TRANSFER DEVICE COMPRISING MASK AND MICRO LED TRANSFERRING METHOD USING THE SAME

(71) Applicant: SAMSUNG ELECTRONICS CO., LTD., Suwon-si (KR)

(72) Inventors: Sangmoo Park, Suwon-si (KR); Doyoung Kwag, Suwon-si (KR); Eunhye Kim, Suwon-si (KR); Minsub Oh, Seoul (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

This patent is subject to a terminal disclaimer.

(21) Appl. No.: 16/682,111

(22) Filed: Nov. 13, 2019

(65) Prior Publication Data

US 2020/0161159 A1 May 21, 2020

(30) Foreign Application Priority Data

Nov. 16, 2018 (KR) ........................ 10-2018-0141429

(51) Int. Cl.
*H01L 21/683* (2006.01)
*H01L 21/67* (2006.01)
*H01L 33/62* (2010.01)

(52) U.S. Cl.
CPC .... *H01L 21/6835* (2013.01); *H01L 21/67144* (2013.01); *H01L 21/67259* (2013.01);
(Continued)

(58) Field of Classification Search
CPC ........... H01L 21/6835; H01L 21/67144; H01L 21/67259; H01L 33/62; H01L 2221/68363;
(Continued)

(56) References Cited

U.S. PATENT DOCUMENTS 6,559,905 B1 5/2003 Akiyama
6,806,918 B2 10/2004 Akiyama
(Continued)

FOREIGN PATENT DOCUMENTS

CN 103201860 A 7/2013
GB 2544335 A 5/2017
(Continued)

OTHER PUBLICATIONS

International Search Report dated Feb. 17, 2020 issued by the International Searching Authority in counterpart International Application No. PCT/KR2019/015110 (PCT/ISA/210).
(Continued)

*Primary Examiner* — Vu A Vu
(74) *Attorney, Agent, or Firm* — Sughrue Mion, PLLC

(57) ABSTRACT

A micro LED transfer device is provided. The micro LED transfer device includes a transfer part configured to arrange a first substrate wherein a plurality of LEDs are disposed on a lower surface relative to an upper surface of a second substrate; a memory storing characteristic information of each of the plurality of LEDs; a laser light source configured to irradiate laser light; a mask comprising a plurality of shutters configured to selectively open and close a plurality of openings of the mask, the mask being interposed between the first substrate and the laser light source; and a processor configured to identify an LED from among the plurality of LEDs to be arranged on the second substrate based on the stored characteristic information, and control the mask such
(Continued)

that a shutter from among the plurality of shutters that corresponds to the LED is opened.

15 Claims, 17 Drawing Sheets

(52) U.S. Cl.
CPC .... *H01L 33/62* (2013.01); *H01L 2221/68363* (2013.01); *H01L 2933/0066* (2013.01)

(58) Field of Classification Search
CPC ......... H01L 2933/0066; H01L 25/0753; H01L 2221/68354; H01L 2221/68322; H01L 21/67294; H01L 2224/95
USPC ............................................................ 438/15
See application file for complete search history.

(56) References Cited

U.S. PATENT DOCUMENTS 7,050,125 B2 5/2006 Akiyama
9,373,274 B2 6/2016 Okuyama
9,375,752 B2 6/2016 Kim
9,786,638 B2 10/2017 Okuyama
9,931,661 B2 4/2018 Kim
10,070,568 B2 * 9/2018 Pourchet ............ H05K 13/0404
10,096,740 B1 * 10/2018 Chen ..................... H01L 27/156
2003/0087476 A1 5/2003 Oohata et al.
2003/0094619 A1 5/2003 Akiyama
2004/0201789 A1 10/2004 Akiyama
2011/0151602 A1 6/2011 Speier
2013/0285086 A1 10/2013 Hu et al.
2014/0370196 A1 12/2014 Kim
2016/0236222 A1 8/2016 Kim
2018/0204749 A1 7/2018 Huska et al.

FOREIGN PATENT DOCUMENTS

JP 2001-7340 A 1/2001
JP 2003-218402 A 7/2003
JP 2004-214499 A 7/2004
JP 4979989 B2 7/2012
KR 10-0772567 B1 11/2007
KR 10-2014-0145886 A 12/2014
KR 10-1801032 B1 11/2017

OTHER PUBLICATIONS

Written Opinion dated Feb. 17, 2020 issued by the International Searching Authority in counterpart International Application No. PCT/KR2019/015110 (PCT/ISA/237).
Communication dated Jul. 13, 2021, from the European Patent Office in European Application No. 19885749.2.

* cited by examiner

LED TRANSFER DEVICE COMPRISING MASK AND MICRO LED TRANSFERRING METHOD USING THE SAME

CROSS-REFERENCE TO RELATED APPLICATION(S)

This application is based on and claims priority under 35 U.S.C. § 119 to Korean Patent Application No. 10-2018-0141429, filed on Nov. 16, 2018, in the Korean Intellectual Property Office, the disclosure of which is incorporated by reference herein in its entirety.

BACKGROUND

1. Field

The disclosure relates to a micro light emitting diode (LED) transfer device including a mask with improved mounting efficiency of micro LEDs and a micro LED transferring method using the same.

2. Description of Related Art

A micro LED is a micro-sized inorganic light emitting material which emits light by itself without a color filter and a backlight. Specifically, a micro LED may refer to a micro-sized LED which has a 1/10 Length and a 1/100 Area of Those of a General LED Chip, and of which width, length, and height are in sizes of 10~100 micrometers (μm).

A micro LED may constitute a light emitting module of a display as it is manufactured in the form of a chip on a wafer, and is arranged on a target substrate.

However, as a semiconductor chip on a wafer is manufactured in a state wherein performances such as colors and brightness are different from one another due to manufacture tolerance in a manufacturing process, differences in performances between each area of a semiconductor chip on a wafer occur.

Accordingly, as a semiconductor chip on a wafer is arranged on a target substrate in an arrangement state wherein performances of areas of the semiconductor chip on a wafer are different from one another, performances differ between each area of the semiconductor chip on a target substrate.

Such differences in performances between each area of a semiconductor chip on a target substrate is accompanied with a problem that the luminance or color of a manufactured display is not uniform.

SUMMARY

Provided are an LED transfer device which transfers a plurality of LEDs, and a LED transferring method thereof.

In accordance with an aspect of the disclosure a light emitting diode (LED) transfer device includes: a transfer part configured to arrange a first substrate wherein a plurality of LEDs are disposed on a lower surface relative to an upper surface of a second substrate; a memory storing characteristic information of each of the plurality of LEDs; a laser light source configured to irradiate laser light; a mask including a plurality of shutters configured to selectively open and close a plurality of openings of the mask, the mask being interposed between the first substrate and the laser light source; and a processor configured to identify an LED from among the plurality of LEDs to be arranged on the second substrate based on the stored characteristic information, and control the mask such that a shutter from among the plurality of shutters that corresponds to the LED is opened.

In accordance with an aspect of the disclosure the processor may be further configured to: identify a plurality of areas of the second substrate, and identify an arrangement location of each of the plurality of LEDs on the second substrate such that output characteristics among the plurality of areas constituting the second substrate are uniform.

In accordance with an aspect of the disclosure the processor may be further configured to identify a first group of LEDs from among the plurality of LEDs to be arranged on the second substrate and a second group of LEDs from among the plurality of LEDs to be arranged between the first group of LEDs on the second substrate.

In accordance with an aspect of the disclosure the first group LEDs consisting of a plurality of LEDs arranged in locations wherein the plurality of openings are opened are simultaneously mounted on the second substrate.

In accordance with an aspect of the disclosure the second substrate is arranged on a stage and is moveable in a horizontal direction.

In accordance with an aspect of the disclosure the characteristic information of the plurality of LEDs may indicate at least one from among an output wavelength, luminance, or a performance level.

In accordance with an aspect of the disclosure each of the plurality of shutters may be a micro electro mechanical system (MEMS).

In accordance with an aspect of the disclosure the LED transfer device may include an adhesive layer interposed between each of the plurality of LEDs and the first substrate, and the laser light may be configured to generate heat in the adhesive layer to detach the plurality of LEDs from the first substrate.

In accordance with an aspect of the disclosure a light emitting diode (LED) transferring method includes: storing characteristic information of a plurality of LEDs disposed on a first substrate; identifying arrangement locations of the plurality of LEDs on a second substrate based on the stored characteristic information; arranging a mask including a plurality of shutters between the first substrate and a laser light source, each of the plurality of shutters being configured to selectively open and close; opening shutters corresponding to the plurality of LEDs of which arrangement locations on the second substrate were determined; and irradiating laser light on the mask.

In accordance with an aspect of the disclosure the LED transferring method may include simultaneously mounting the first group of LEDs irradiated with the laser light on the second substrate.

In accordance with an aspect of the disclosure the LED transferring method may include moving the second substrate in a horizontal direction after the first group of LEDs is mounted.

In accordance with an aspect of the disclosure the identifying the arrangement locations of the plurality of LEDs on the second substrate may include: identifying a plurality of areas of the second substrate; and identifying the arrangement locations of the plurality of LEDs on the second substrate such that output characteristics among the plurality of areas constituting the second substrate are uniform.

In accordance with an aspect of the disclosure the LED transferring method may include: identifying first group of LEDs to be arranged on the second substrate and a second group of LEDs to be arranged between the first group of LEDs among the plurality of LEDs on the first substrate.

In accordance with an aspect of the disclosure the characteristic information of the plurality of LEDs may indicate at least one from among an output wavelength, luminance, or a performance level.

In accordance with an aspect of the disclosure a non-transitory computer-readable recording medium includes a program for executing a light emitting diode (LED) transferring method, wherein the LED transferring method includes: storing characteristic information of a plurality of LEDs disposed on a first substrate; identifying arrangement locations of the plurality of LEDs on a second substrate based on the stored characteristic information; arranging a mask including a plurality of shutters between the first substrate and a laser light source, each of the plurality of shutters being configured to selectively open and close; selectively opening and closing shutters from among the plurality of shutters that correspond to the plurality of LEDs disposed at arrangement locations that correspond to the arrangement locations on the second substrate; and controlling the laser light source to irradiate laser light on the mask.

BRIEF DESCRIPTION OF THE DRAWINGS

FIGS. 11A and 11B are top surface views of a top surface view of a second substrate illustrating a state wherein a plurality of micro LEDs have been transferred by another micro LED transferring method according to an embodiment.

DETAILED DESCRIPTION

Hereinafter, embodiments will be described with reference to the accompanying drawings, for comprehensive understanding of embodiments. The disclosure is not limited to the embodiments described herein, but may be implemented in various forms, and various modifications may be made to the embodiments. The descriptions of the embodiments are provided to make the descriptions complete, and to make people having ordinary knowledge in the technical field to which the disclosure belongs fully understand the range of the disclosure. In the accompanying drawings, components are not necessarily drawn to scale, and some components may be illustrated to be larger than their actual sizes for the convenience of description, and the proportion of each component may be exaggerated or reduced.

Also, in case it is described that a component is "on top of" or "contacts" another component, it should be understood that a component may directly contact or be connected with the top portion of another component, but still another component may exist between the components. In contrast, in case it is described that a component is "directly on top of" or "directly contacts" another component, it may be understood that still another component does not exist between the components. Other expressions describing relations between components, for instance, expressions such as "between ~" and "directly between ~" may be interpreted in the same manner.

Further, terms such as "first," "second" and the like may use corresponding components regardless of importance or order and are used to distinguish one element from another without limiting the components.

Singular expressions include plural expressions, unless defined differently in the context. Also, terms such as "include" or "have" should be construed as designating that there are such characteristics, numbers, steps, operations, elements, components or a combination thereof described in the specification, and may be interpreted to denote that one or more of other characteristics, numbers, steps, operations, elements, components or a combination thereof may be added.

The terms used in the embodiments may be given meanings generally known to those of ordinary skill in the art unless defined differently in the disclosure.

The display module according to an embodiment of the disclosure may be applied to an electronic product or an electronic device that requires a wearable device, a portable device, a handheld device, or various displays, in a single unit. The display module can also be applied to a small display device such as a monitor for a personal computer, a TV, etc. and a large display device such as a digital signage, an electronic display through a plurality of assembly arrangements.

Hereinafter, the configuration of the micro LED transfer device 1 according to an embodiment will be described with reference to FIGS. 1 and 2.

Figure 1:
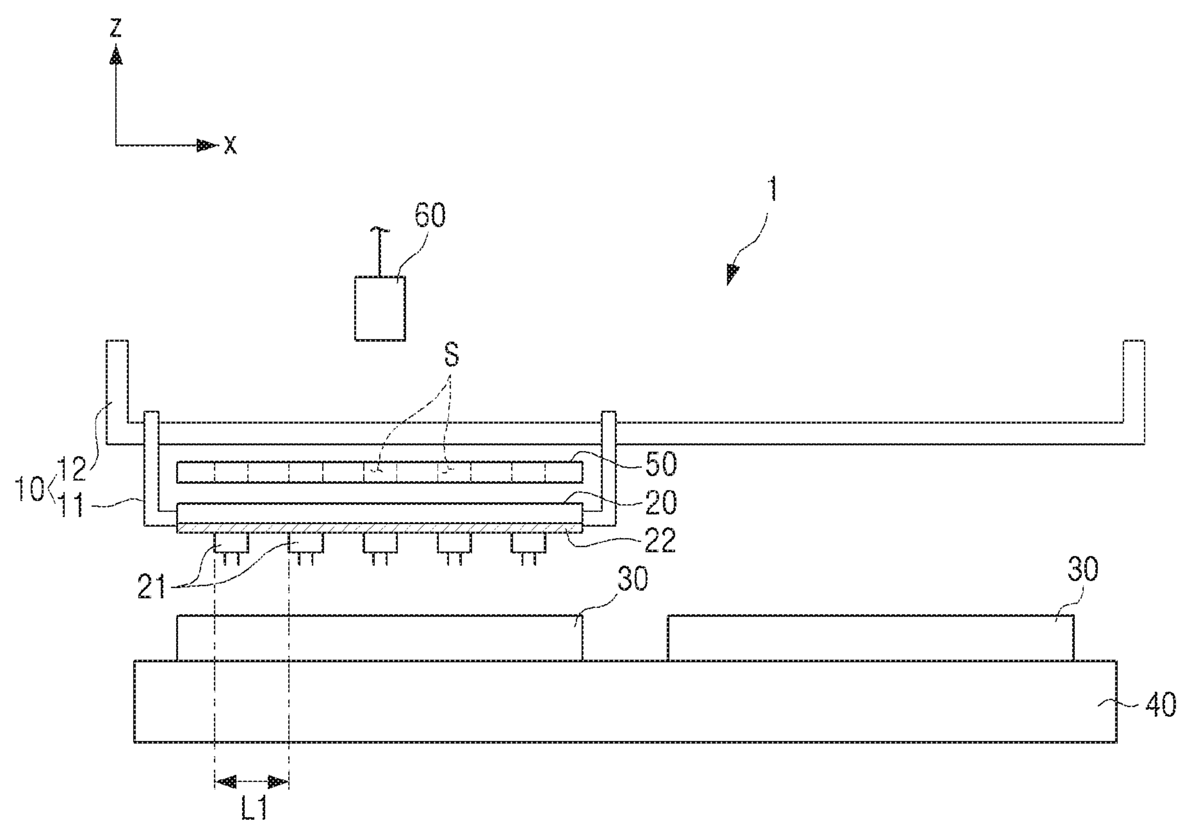
FIG. 1 is a schematic diagram illustrating a micro LED transfer device according to an embodiment.
Figure 2:
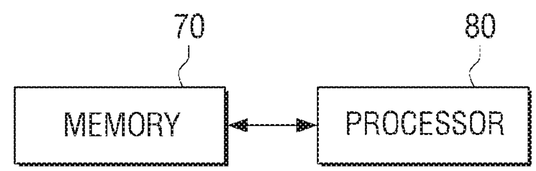
FIG. 2 is a block diagram illustrating a memory and a processor according to an embodiment.

FIG. 1 is a schematic diagram illustrating a micro LED transfer device 1 according to an embodiment, and FIG. 2 is a block diagram illustrating a memory 70 and a processor 80.

As illustrated in FIG. 1, the micro LED transfer device 1 may include a transfer part 10 which arranges a first substrate 20 wherein a plurality of micro LEDs 21 are arranged in the lower part in the upper part of a second substrate 30, a memory 70 storing characteristic information of each of the plurality of micro LEDs 21, a laser light source 60 irradiating laser light L, a mask 50 including a plurality of shutters 51 (refer to FIG. 3) which are arranged between the first substrate 20 and the laser light source 60, and selectively open and close each of a plurality of openings S, and a processor 80 determining a micro LED 21 to be arranged on the second substrate 30 based on the stored characteristic information, and controlling the mask 50 such that a shutter 51 corresponding to the determined micro LED 21 is opened among the plurality of shutters 51.

The transfer part 10 may include a fixing member 11 that may be connected with the first substrate 20 and move the first substrate 20, and a guide member 12 that may be connected with the fixing member 11 and guide the movement of the fixing member 11.

In addition, the transfer part 10 may move in up, down, left, and right directions along a spatial coordinate system (X, Y, and Z axes) on the first substrate 20 and the second substrate 30, and also, rotate with the X, Y, and Z axes as the center.

Accordingly, the transfer part 10 may move to various locations of a plurality of second substrates 30 arranged on a stage 40, while the first substrate 20 is fixed.

It is illustrated that the fixing member 11 fixes the edge area of the first substrate 20, but the disclosure is not limited thereto, and the fixing member 11 may be constituted in various configurations, as long as it can be connected with various portions of the first substrate 20 and stably fix the first substrate 20.

The guide member 12 may be arranged in the upper part of the second substrate 30, and move the fixing member 11 connected with the first substrate 20 on the second substrate 30. Also, the guide member 12 may be coupled to a structure.

In addition, the guide member 12 may move the fixing member 11 through various structures such as a multi joint structure, a piston structure, a sliding structure, etc. Also, depending on needs, the guide member 12 itself may move.

The first substrate 20 may be a wafer. On the first substrate 20, a plurality of grown micro LEDs 21 may be arranged on various substrates such as a sapphire substrate.

The micro LED 21 may consist of an inorganic light emitting material of which width, length, and height are in sizes equal to or smaller than 100 μm, and may irradiate light by itself in case power is supplied.

Also, the micro LED 21 has a fast reaction speed, low power consumption, and high luminance, and is thus gaining popularity as a light emitting diode for next generation displays. Specifically, the micro LED 21 has higher efficiency in converting electricity into light compared to conventional LEDs or organic light emitting diodes (OLEDs).

That is, the micro LED 21 has higher "brightness per watt" compared to conventional LEDs or OLED displays. By virtue of this, the micro LED 21 can exert the same brightness even with energy that is approximately half compared to conventional LEDs or OLEDs.

Other than the above, the micro LED 21 can implement a high resolution, excellent colors, contrast, and brightness, and can thus express colors in a wide range precisely, and can also implement a clear screen even in outdoors where sunlight is bright. Also, the micro LED 21 is strong against a burn in phenomenon and provides a small amount of heat, and accordingly, a long lifespan is guaranteed without deformation.

In addition, the micro LED 21 may be a red micro LED emitting red light, a green micro LED emitting green light, or a blue micro LED emitting blue light.

On one wafer, one type of micro LED which emits a single color may be arranged.

For example, in case the first substrate 20 is a wafer, on the first substrate 20, only a red micro LED emitting red light, a green micro LED emitting green light, or a blue micro LED emitting blue light may be constituted.

In case the first substrate 20 is a relay substrate, on the first substrate 20, a red micro LED, a green micro LED, and a blue micro LED may be arranged in combination.

For example, on the first substrate 20, a red micro LED, a green micro LED, and a blue micro LED may be arranged to constitute one pixel.

On the second substrate 30, a plurality of micro LEDs 21 may be mounted, and the second substrate 30 may be physically and electronically connected with the plurality of micro LEDs 21.

For example, the second substrate 30 is a target substrate, and may be constituted as a printed circuit board (PCB), or a relay substrate.

In addition, the second substrate 30 may be in various sizes and forms, unlike the size of the first substrate 20.

The stage 40 is a component on which the second substrate 30 is loaded, and unloaded, respectively, and may be formed as a flat board. Also, the stage 40 may relatively move with respect to the transfer part 10 while the second substrate 30 is loaded.

The mask 50 may be arranged on the first substrate 20, and make laser light L emitted from the laser light source 60 pass through the first substrate 20.

The detailed configuration of the mask 50 will be described later with reference to FIG. 3A.

The laser light source 60 may emit laser light L for lifting off the plurality of micro LEDs 21 arranged in the lower part of the first substrate 20.

The laser light source 60 may directly irradiate laser light L through the first substrate 20, or change the directivity of light by introducing a member such as a P-lens into the route of laser light L.

In addition, the laser light source 60 may emit various types of laser light such as spot laser and line laser, etc. Also, output of the laser light source 60 may vary according to the needs of users.

The memory 70 may be contained inside the micro LED transfer device 1. Also, the memory 70 may be implemented as at least one of a flash memory type memory, a read-only memory (ROM), a random-access memory (RAM), a hard disk type memory, a multimedia card micro type memory, or a card type memory (e.g., a Secure Digital (SD) or XD memory, etc.).

Also, as illustrated in FIG. 2, the memory 70 is electronically connected with the processor 80, and thus it may transmit signals and information with the processor 80 mutually. Accordingly, the memory 70 may store input or searched characteristic information of the plurality of micro LEDs 21 and transmit the stored characteristic information to the processor 80.

The processor 80 is contained inside the micro LED transfer device 1, and controls the overall operations of the micro LED transfer device 1. In addition, the processor 80 may perform the function of controlling the overall operations of the micro LED transfer device 1.

That is, the processor 80 may be electronically connected with the transfer part 10, the stage 40, the mask 50, and the laser light source 60, and may control each of the components.

For example, the processor 80 may control the transfer part 10, and transfer the first substrate 20 wherein the plurality of micro LEDs 21 are arranged in the lower part to the upper part of the second substrate 30. Also, the processor 80 may move the stage 40, and control the laser light source 60 to irradiate laser light L.

However, the disclosure is not limited to controlling all components by one processor 80, but each component may be controlled by using several independent processors.

Here, the processor 80 may include one or more of a central processing unit (CPU), a controller, an application processor (AP) or a communication processor (CP), or an ARM processor.

Also, the processor 80 may be electronically connected with the memory 70, and may use characteristic information of the plurality of micro LEDs 21 stored in the memory 70. Specific functions of the processor 80 according to an embodiment will be described later.

Hereinafter, the detailed configuration of the mask 50 will be described with reference to FIGS. 3A and 3B.

Figure 3A:
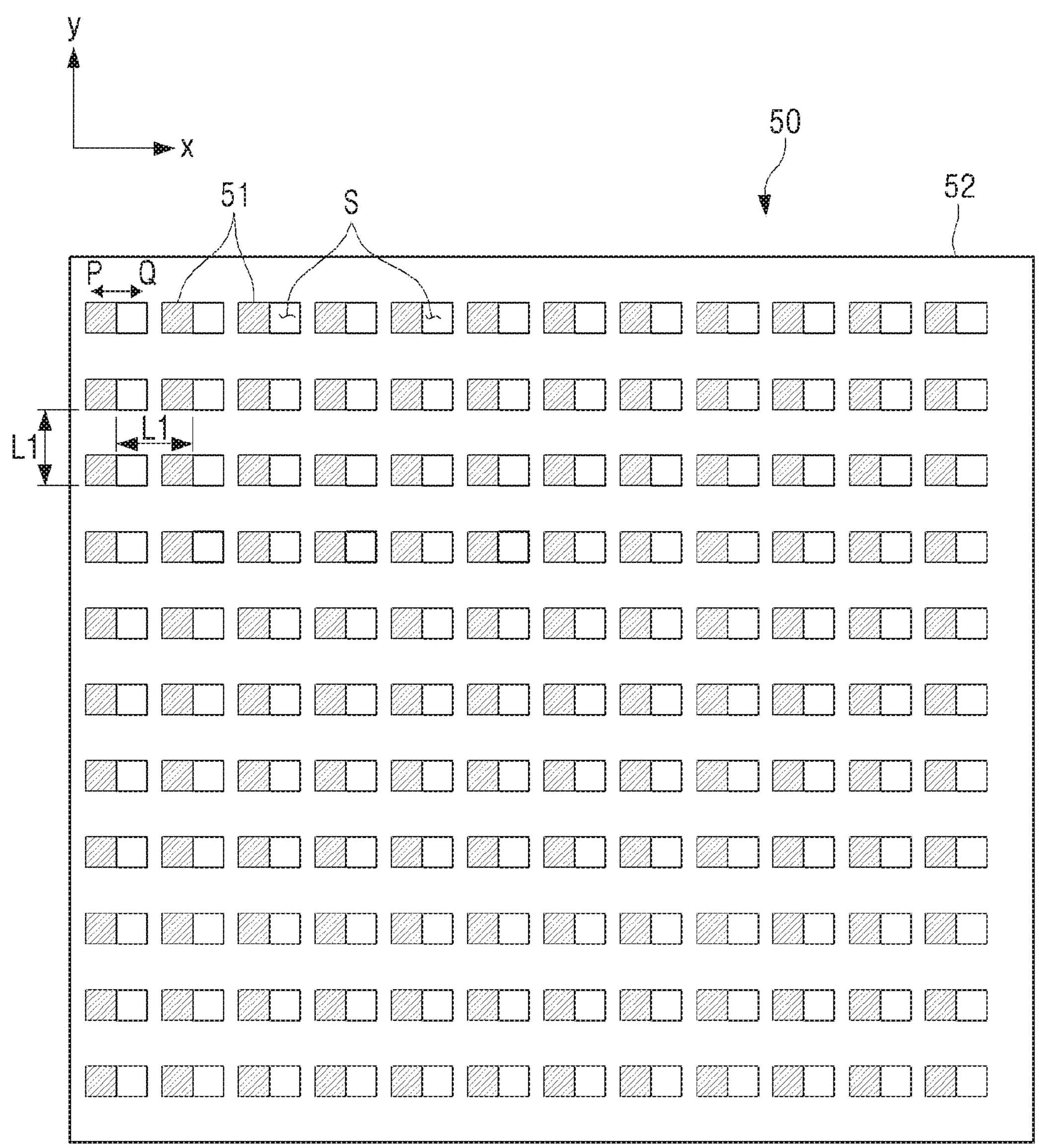
FIG. 3A is a top surface view illustrating a mask according to an embodiment.
Figure 3B:
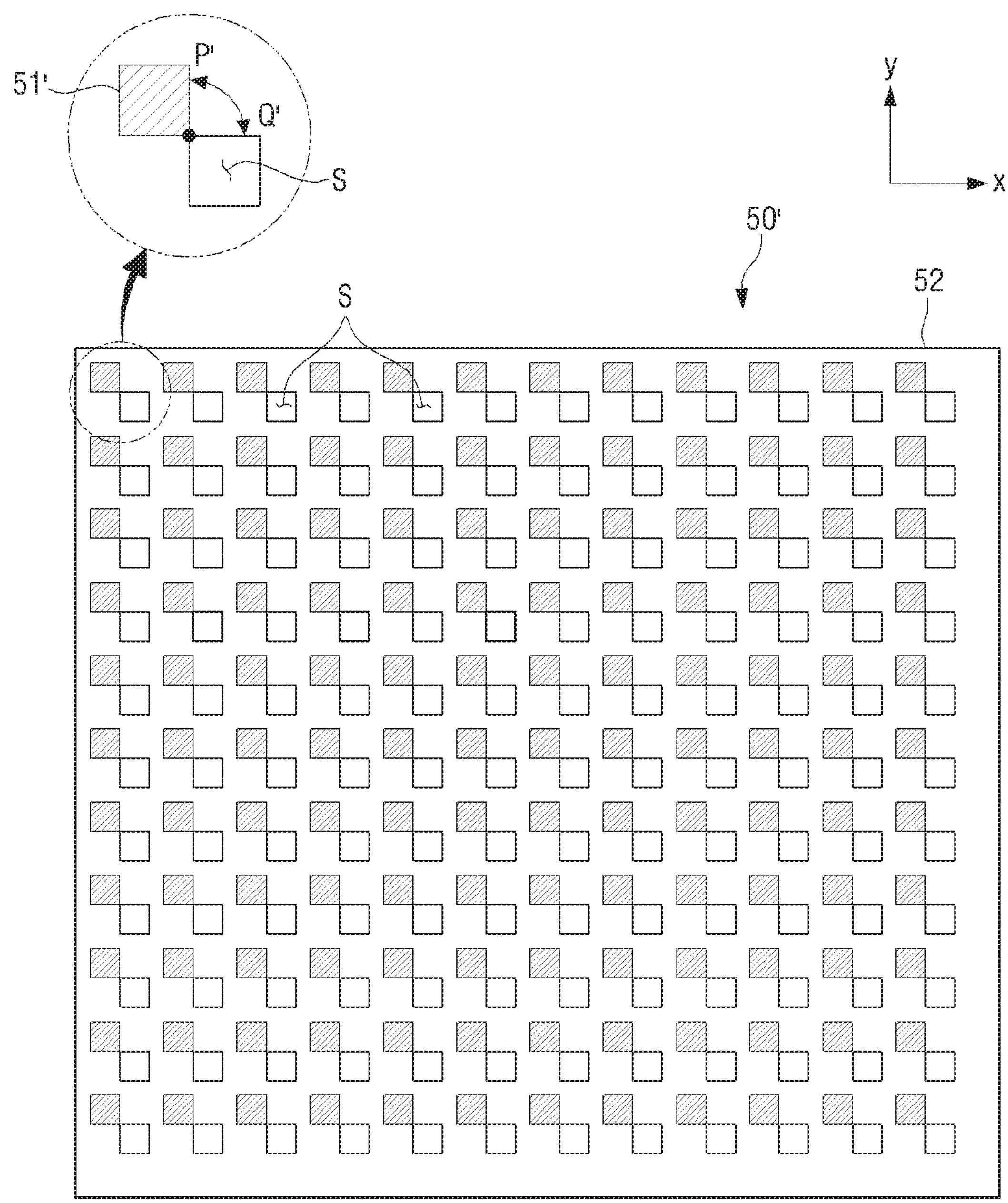
FIG. 3B is a top surface view illustrating a mask according to a modified embodiment.

FIG. 3A is a top surface view illustrating a mask 50 according to an embodiment, and FIG. 3B is a top surface view illustrating a mask 50' according to a modified embodiment.

As illustrated in FIG. 3A, the mask 50 may include a plurality of openings S arranged at a first interval L1 with one another on a flat mask surface 52 and shutters 51 arranged on each of the plurality of openings S.

The mask surface 52 consists of a material which laser light L cannot pass through, and may have thermal resistance for durability against laser light L. In addition, in the upper part of the mask surface 52, a thermal resistant material for enhancing thermal resistance against laser light L may be applied.

In addition, on the mask surface 52, a plurality of openings S may be formed at a first interval L1. The plurality of openings S may make laser light L irradiated on the mask 50 pass through.

Accordingly, the micro LEDs on the first substrate 20 in corresponding locations to the plurality of openings S may be detached from the lower surface 20*a* of the first substrate 20 by laser light L.

The forms of the plurality of openings S may be various forms as long as the openings can detach the plurality of micro LEDs 21 on the first substrate 20.

Also, the plurality of openings S may be formed on the mask 50 at a first interval L1. Here, the first interval L1 may be set in consideration of the interval among the plurality of micro LEDs 21 on the first substrate 20.

For example, in case the plurality of micro LEDs 21 on the first substrate 20 are arranged at a first interval L1, the plurality of openings S may be formed at the first interval L1 so as to be formed in locations corresponding to each of the plurality of micro LEDs 21.

In addition, in order to arrange the plurality of micro LEDs 21 on the first substrate 20 at a first interval L1 on the second substrate 30, the mask 50 wherein the plurality of openings S arranged at the first interval L1 are formed may be used.

Accordingly, the first interval L1 may vary according to users' settings. For example, the first interval L1 may be from several micrometers to several nanometers.

There may be a plurality of shutters 51, and they may be arranged on each of the plurality of openings S. Also, the shutters 51 may move independently for selectively opening and closing each of the plurality of openings S.

For example, as illustrated in FIG. 3A, the shutters 51 may be coupled such that they can slide-operate on the plurality of openings S. Accordingly, in case the shutters 51 move in a Q direction, the openings S may be closed, and in case the shutters 51 move in a P direction, the openings S may be opened.

Accordingly, the shutters 51 arranged on each of the plurality of openings S in corresponding locations to the micro LEDs to be transferred on the first substrate 20 may move in a P direction to open the plurality of openings S.

In addition, the shutters 51 arranged on each of the plurality of openings S in corresponding locations to the micro LEDs not to be transferred on the first substrate 20 may move in a Q direction to close the plurality of openings S.

Accordingly, only the openings S in corresponding locations to the plurality of micro LEDs 21 to be mounted on the first substrate 20 by using the shutters 51 may be opened to transfer only the plurality of selected micro LEDs 21 on the second substrate 30.

Also, each of the plurality of shutters 51 may be a micro electro mechanical system (MEMS). A micro electro mechanical system (MEMS) is an ultra-high density integrated circuit manufactured by processing silicon or crystal, glass, etc., and enables mass production of micro-sized products at a low cost by applying a fine processing technology of semiconductors repeating processes such as deposition and etching, etc., and may provide currents with a driving force by using an electrostatic force which is a pulling force between electric charges and surface tension, etc. and may thereby reduce the amount of power consumption greatly.

Accordingly, according to the control of the processor 80, control signals or currents are transmitted independently to each shutter 51, and the shutter 51 may thereby be controlled swiftly.

As illustrated in FIG. 3B, the shutters 51' of the mask 50' may be coupled to each of the plurality of openings S in a rotating manner. Accordingly, the shutters 51' may rotate in a Q' direction with a rotation axis O as the center to close the openings S, and may rotate in a P' direction to open the openings S.

Hereinafter, the operations of the micro LED transfer device 1 according to an embodiment will be described with reference to FIGS. 4A and 4B.

Figure 4A:
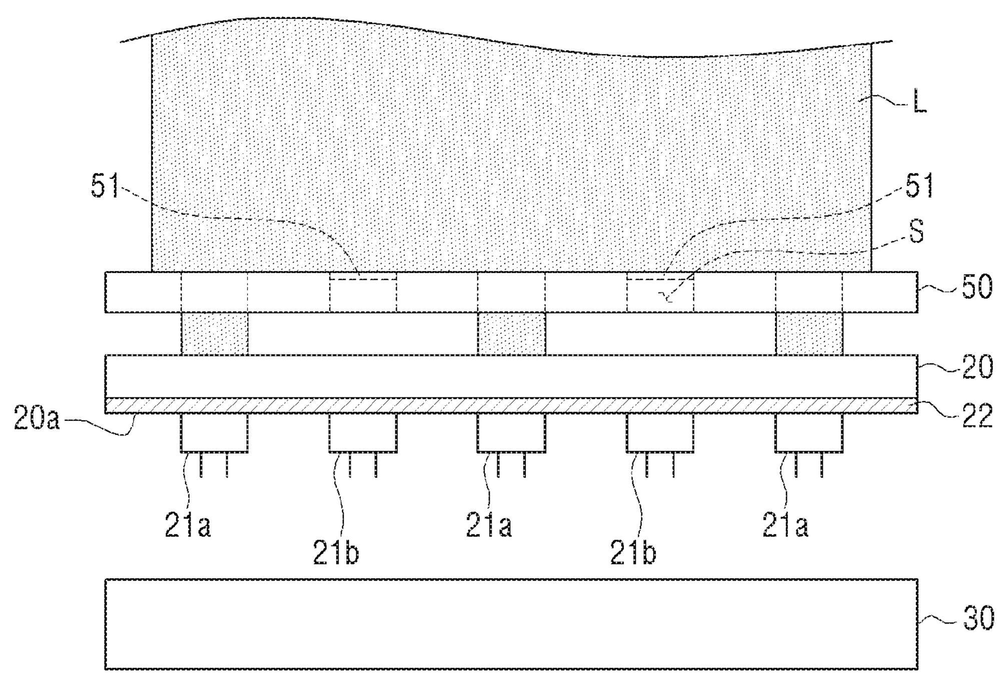
FIG. 4A is a schematic diagram illustrating an operation of a micro LED transfer device according to an embodiment.
Figure 4B:
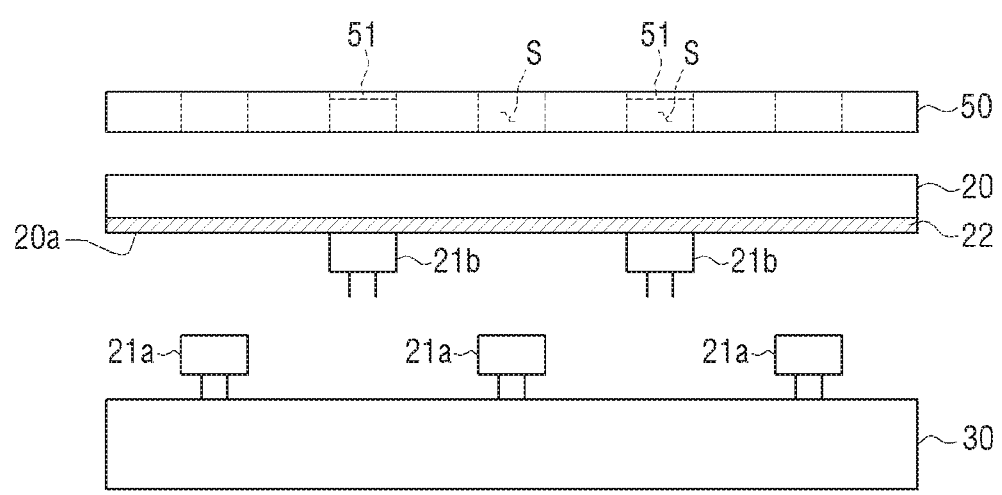
FIG. 4B is a schematic diagram illustrating an operation of a micro LED transfer device according to an embodiment.

FIGS. 4A and 4B are schematic diagrams illustrating operations of a micro LED transfer device 1 according to an embodiment.

First, as illustrated in FIG. 4A, laser light L irradiated from the laser light source 60 is irradiated on the mask 50 arranged between the first substrate 20 and the laser light source 60.

Here, for opening the openings S in corresponding locations to the first group micro LEDs 21*a* to be mounted on the second substrate 30 by the processor 80, the mask 50 may open the openings S by operating the shutters 51 arranged on the openings S in corresponding locations to the first group micro LEDs 21*a*.

In addition, for closing the openings S in corresponding locations to the second group micro LEDs 21*b* not to be mounted on the second substrate 30, the mask 50 may close the openings S by operating the shutters 51 arranged on the openings S in corresponding locations to the second group micro LEDs 21*b*.

Accordingly, the laser light L may pass the opened openings S, and may transmit heat to the first group micro LEDs 21*a* in corresponding locations to the openings S.

Afterwards, the transmitted heat may be transmitted to an adhesive layer 22 arranged between the plurality of micro LEDs 21 and the first substrate 20, and reduce the adhesive force of the adhesive layer 22, and may thereby detach the first group micro LEDs 21*a* from the first substrate 20 to the second substrate 30.

In addition, the adhesive layer 22 may fix the plurality of micro LEDs 21 on the lower surface 20*a* of the first substrate 20, and may be constituted in various materials and forms as long as it can detach the plurality of micro LEDs 21 in case heat is transmitted.

Here, the first group micro LEDs 21*a* may indicate micro LEDs mounted to be on the second substrate 30, and the second group micro LEDs 21*b* may indicate micro LEDs to not be mounted on the second substrate 30.

In addition, the first group micro LEDs 21*a* and the second group micro LEDs 21*b* are determined by the processor 80, and the detailed determining process will be described later.

Afterwards, as illustrated in FIG. 4B, the first group micro LEDs 21*a* may be arranged on the second substrate 30, and the second group micro LEDs 21*b* may be arranged on the first substrate 20.

That is, by using the mask 50 wherein the shutters 51 are provided on each of the plurality of openings S, the plurality of micro LEDs 21 arranged on the lower surface 20*a* of the first substrate 20 may be selectively transferred on the second substrate 30.

Hereinafter, a selective transferring process of the micro LEDs 21 using the processor 80 and the mask 50 will be described in detail with reference to FIGS. 5 to 8B.

Figure 5:
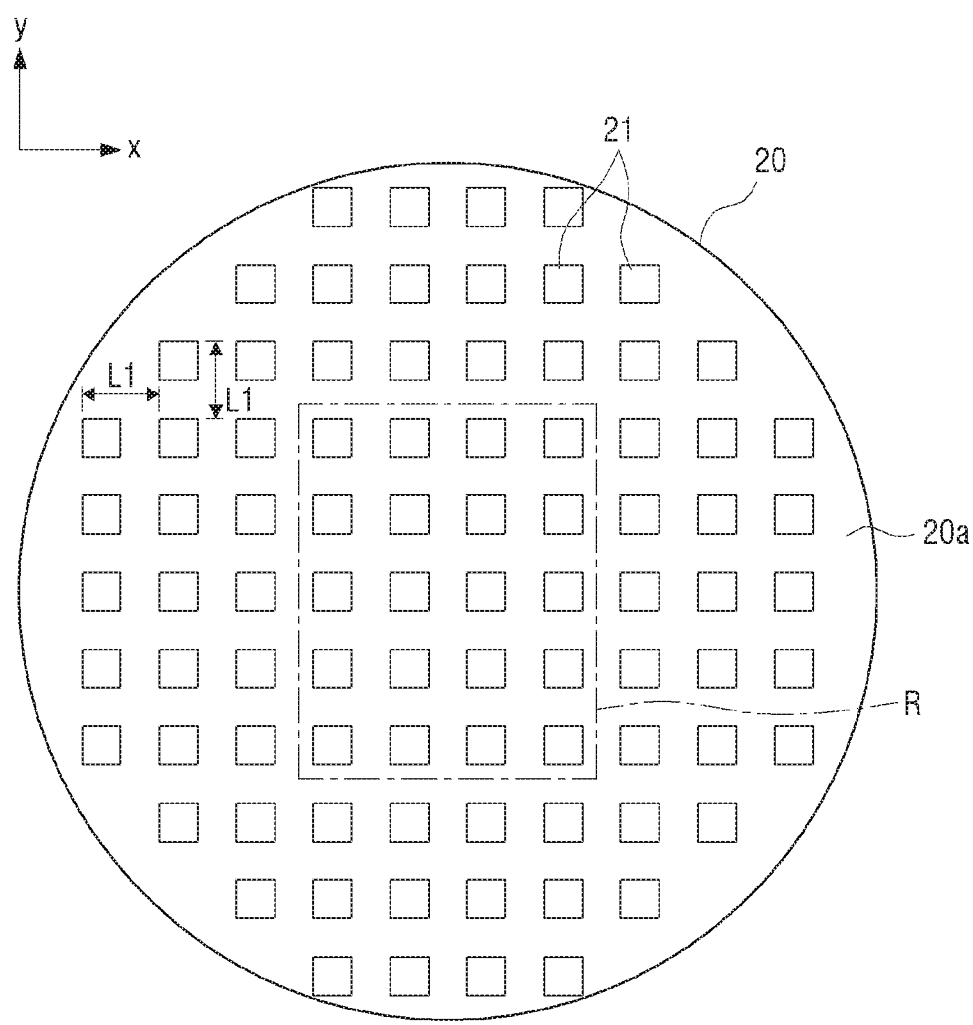
FIG. 5 is a bottom surface view of a first substrate according to an embodiment.
Figure 6:
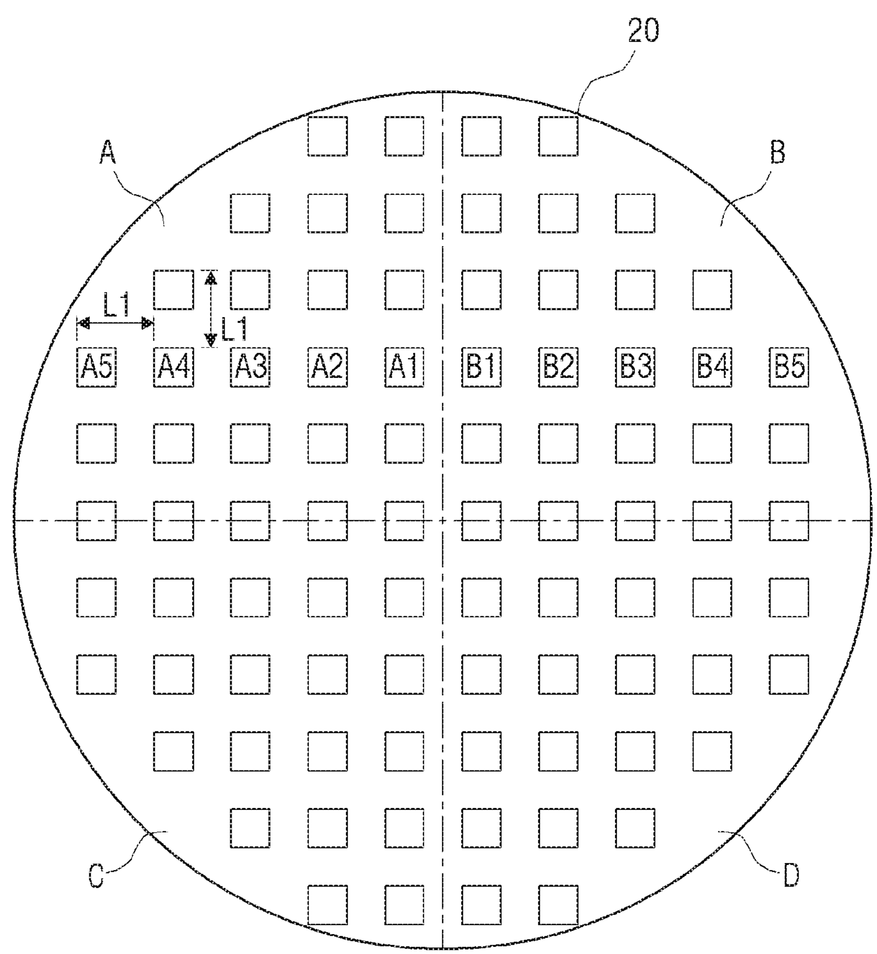
FIG. 6 is a bottom surface view illustrating a state wherein characteristic information of a plurality of micro LEDs has been input in FIG. 1.
Figure 7:
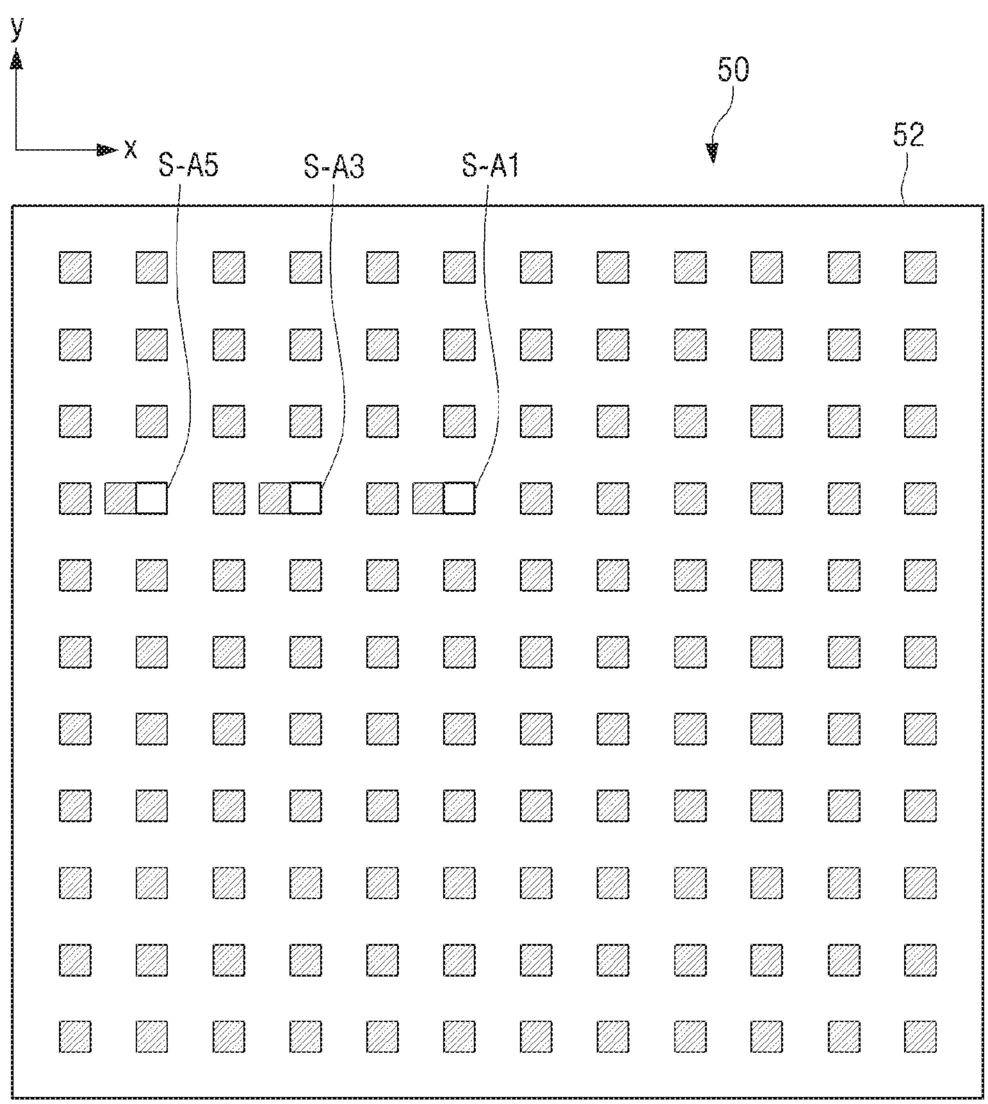
FIG. 7 is a top surface view illustrating an operation of a mask according to an embodiment.
Figure 8A:
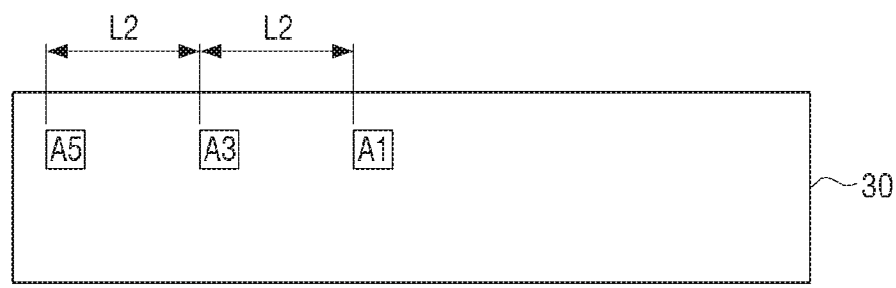
FIG. 8A is a top surface view of a second substrate illustrating a process wherein a plurality of micro LEDs are transferred on a second substrate according to an embodiment.
Figure 8B:
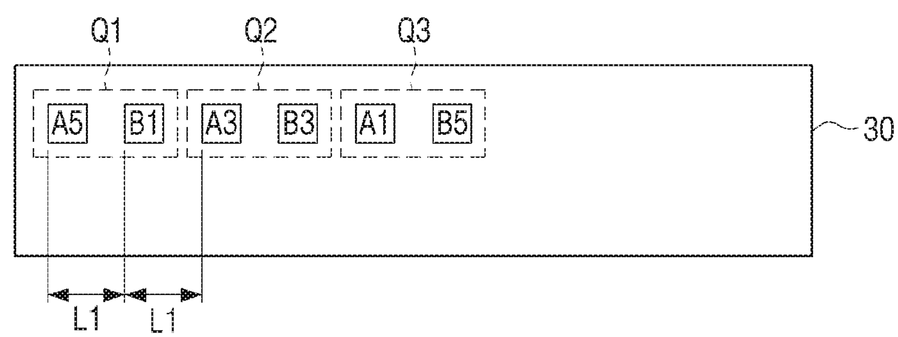
FIG. 8B is a top surface view of a second substrate illustrating a process wherein a plurality of micro LEDs are transferred on a second substrate according to an embodiment.

FIG. 5 is a bottom surface view of the first substrate 20. FIG. 6 is a bottom surface view illustrating a state wherein characteristic information of the plurality of micro LEDs 21 has been input in FIG. 1. FIG. 7 is a top surface view illustrating an operation of the mask 50 according to an embodiment. FIGS. 8A and 8B are top surface views of the second substrate 30 illustrating a process wherein the plurality of micro LEDs 21 are transferred on the second substrate 30.

As illustrated in FIG. 5, on the lower surface 20*a* of the first substrate 20, the plurality of micro LEDs 21 may be arranged at a first interval L1. The number of the plurality of micro LEDs 21 arranged on the first substrate 20 was illustrated for the convenience of explanation, and the micro LEDs are not limited to the number and size formed in FIG. 3.

Because of the manufacture tolerance in the manufacturing process of the plurality of micro LEDs 21, the characteristic of a specific area R on the first substrate 20 may be good. Specifically, the characteristic of a micro LED located in a specific area R on the first substrate 20 may be better than the characteristics of the plurality of micro LEDs 21 located in areas other than the specific area R of the first substrate 20.

Here, the characteristics of the plurality of micro LEDs 21 may be at least one of an output wavelength, luminance, or a performance level.

Specifically, an output wavelength is related to the color that is emitted and expressed by the micro LED 21, and according to the output wavelength, the color expressed by the micro LED 21 may differ.

For example, in case the micro LED 21 emits light in a wavelength range of approximately between 630 nm and 780 nm, a red color may be expressed, in case the micro LED 21 emits light in a wavelength range of approximately between 520 nm and 570 nm, a green color may be expressed, and in case the micro LED 21 emits light in a wavelength range of approximately between 420 nm and 480 nm, a blue color may be expressed.

More specifically, in case a micro LED expressing a green light in a wavelength range of approximately between 520 nm and 570 nm is arranged on the first substrate 20, a wavelength range close to approximately 520 nm may express a bluish green color, and a wavelength range close to approximately 570 nm may express a yellowish green color.

Accordingly, the characteristic of the micro LED 21 may vary according to the output wavelength emitted by the micro LED 21.

Also, luminance indicates brightness of a light source having a specific range, and according to the luminance of the plurality of micro LEDs 21 arranged on the first substrate 20, brightness expressed by the plurality of micro LEDs 21 may vary.

In addition, a performance level classifies output wavelengths or luminance according to specific standards, and the specific standards may vary depending on the needs of users.

For example, in case a performance level is based on output wavelengths, as a wavelength is closer to a wavelength range of a specific standard, the performance level may be set as a higher level, and as a wavelength is farther from a wavelength range of a specific standard, the performance level may be set as a lower level.

Also, in case a performance level is based on luminance, as the luminance is higher, the performance level may be set as a higher level, and as the luminance is lower, the performance level may be set as a lower level.

In addition, for a performance level, both of output wavelengths and luminance may be considered according to arbitrary standards of users. For example, a performance level may be set while placing a value of U/100 on the output wavelength (here, U is a rational number in an amount of equal to or smaller than 100), and placing a value of (100−U)/100 on luminance according to the characteristic that a user intends to implement on the micro LED 21.

Referring to FIG. 5, the characteristics of the plurality of micro LEDs 21 may be measured by using an external measuring device with respect to the plurality of micro LEDs 21 arranged on the first substrate 20. Afterwards, the measured characteristic information may be stored in the memory 70.

Alternatively, the characteristic information stored in the memory 70 may be input through a separate input device.

As illustrated in FIG. 5, the processor 80 may determine a performance level for each of the plurality of micro LEDs 21 arranged on the first substrate 20, by using the characteristic information stored in the memory 70.

As illustrated in FIG. 6, the processor 80 may divide the first substrate 20 into a plurality of areas A, B, C, D based on the characteristic information stored in the memory 70 and the determined performance levels.

For example, a micro LED having a performance of the first level in the A area of the first substrate 20 may be referred to as an A1-micro LED, and a chip having a performance of the fifth level in the A area may be referred to as an A5-micro LED.

Likewise, a chip having a performance of the first level in the B area of the first substrate 20 may be referred to as a B1-micro LED, and a chip having a performance of the fifth level in the B area may be referred to as a B5-micro LED.

In addition, the processor 80 may divide the second substrate 30 into a plurality of areas Q3 to Q5, and determine the arrangement locations of each of the plurality of micro LEDs 21, such that the output characteristics among the plurality of areas Q3 to Q5 constituting the second substrate 30 are uniform.

Here, the arrangement locations mean the locations wherein the plurality of micro LEDs 21 are arranged on the second substrate 30, and these mean the arrangement in which the plurality of micro LEDs 21 are re-arranged.

Also, the processor 80 may determine the arrangement locations of each of the plurality of micro LEDs 21 on the second substrate 30, such that the output characteristics among the plurality of areas constituting the second substrate 30 are uniform.

In addition, based on the determined arrangement locations, the processor 80 may determine the first group micro LEDs 21*a* to be arranged on the second substrate 30 and the second group micro LEDs 21*b* to be arranged between the first group micro LEDs 21*a*, among the plurality of micro LEDs 21 on the first substrate 20.

Accordingly, as illustrated in FIG. 7, the processor 80 may open openings S-A5, S-A3, S-A1 in the corresponding locations to the first group micro LEDs 21*a* by using the shutter 51.

For example, in case the processor 80 determines the A-5 micro LED, the A3-micro LED, and the A1-micro LED as the first group micro LEDs 21*a* based on characteristic information, the processor 80 may open the openings S-A5, S-A3, S-A1 in the corresponding locations to the first group micro LEDs 21*a*.

Afterwards, as illustrated in FIG. 8A, the processor 80 may irradiate the laser light source 60 on the mask 50, and transfer the first group micro LEDs 21*a* in the corresponding locations to the openings S-A5, S-A3, S-A1 on the second substrate 30.

Here, the first group micro LEDs 21*a* consisting of a plurality of micro LEDs arranged in the locations wherein the plurality of openings S are open may be mounted on the second substrate 30 simultaneously. Accordingly, the speed by which the first group micro LEDs 21*a* are mounted on the second substrate 30 may be heightened, and transfer efficiency may thereby be improved.

Next, after the first group micro LEDs 21*a* are transferred on the second substrate 30, the second group micro LEDs 21*b* may be transferred between the first group micro LEDs 21*a*.

Here, the first group micro LEDs 21*a* may be transferred at a second interval L2, and the second interval L2 may be bigger than the first interval L1 which is an interval among the plurality of micro LEDs 21 arranged on the first substrate 20, and may be bigger than the first interval L1 in interval times.

In addition, the processor 80 may determine the second interval L2 such that the output characteristics or the average values of the performance levels among specific areas Q1 to Q3 on the second substrate 30 are uniform, based on the characteristic information of the A1 to A5 micro LEDs in the A area and the B1 to B5 micro LEDs in the B area stored in the memory 70.

For example, referring to FIG. 8B, the average value of the performance levels of the A5-micro LED and the B1-micro LED included in the first area Q1 on the second substrate 30 is 3, and the average value of the performance levels of the A3-micro LED and the B3-micro LED included in the second area Q2 is 3, and the average value of the performance levels of the A1-micro LED and the B5-micro LED included in the third area Q3 is 3.

Accordingly, for implementing the standard deviation and the average value as the micro LEDs mounted on the second substrate 30 as in FIG. 8B, the processor 80 may determine the interval of the first group micro LEDs 21*a* as the second interval L2 which is two times bigger than the first interval L1 of the plurality of micro LEDs 21 on the first substrate 20.

Also, the processor 80 may determine the second interval L2 which makes the output characteristics or the standard deviation of the performance levels among the specific areas Q1 to Q3 on the second substrate 30 included in a predetermined range.

For example, based on the characteristic information of the plurality of micro LEDs 21 arranged on the first substrate 20, the processor 80 may execute simulation with respect to the arrangement on the second substrate 30 according to the second interval L2.

Specifically, the processor 80 may calculate a standard deviation with respect to the performance levels of the plurality of micro LEDs 21 included in the specific areas Q1 to Q3 of the second substrate 30, and if the standard deviation is within a predetermined range, may determine the first group micro LEDs 21*a* which are in the arrangement locations determined at the processor 80 and at the second interval L2 and arrange the first group micro LEDs 21*a* on the second substrate 30.

In addition, if the calculated standard deviation exceeds a predetermined range, the processor 80 may calculate a new standard deviation based on new arrangement locations and the second interval L2.

Here, the specific areas Q1 to Q3 are random areas and may have various forms, ranges, and width according to users' choices.

Also, the average values and the standard deviation among the specific areas Q1 to Q3 were suggested as an example for determining whether the performance levels of the plurality of micro LEDs 21 mounted on the second substrate 30 have uniform distribution.

Accordingly, for determining whether the performance levels of the plurality of micro LEDs 21 have uniform distribution, not only the average values and the standard deviation of the specific areas Q1 to Q3, but also various measurement calculation methods of distribution that can be used in statistics such as dispersion, the degree of scattering, etc. may be used.

In addition, the disclosure is not limited to evaluating the performance levels of all the micro LEDs 21 included in a specific area, but a sample of a plurality of chips included in a specific area may be calculated and the distribution of each performance level may be determined.

For example, distribution may be determined through various samples such as the average value of the maximum value and the minimum value, the median value, etc. among the performance levels of chips included in a specific area depending on needs, in consideration of the degree of overload, the time for calculation, etc. of the processor 80.

Hereinafter, the process after some micro LEDs are mounted will be described with reference to FIGS. 9 to 10B.

Figure 9:
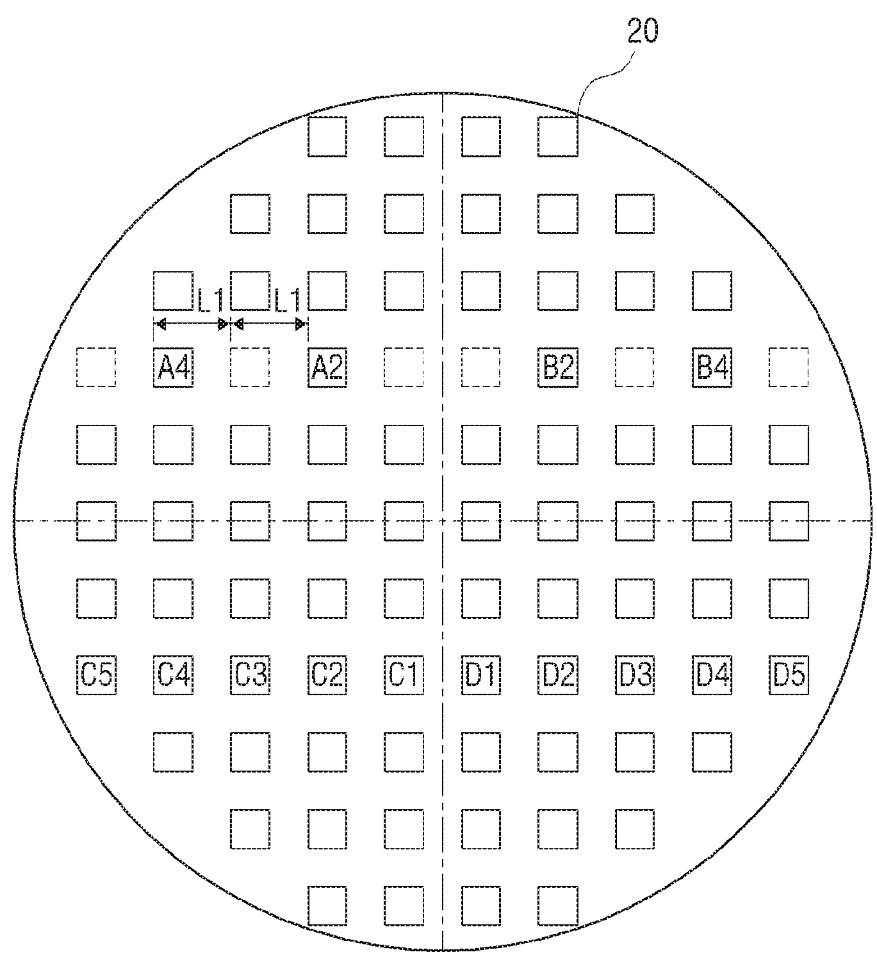
FIG. 9 is a bottom surface view illustrating a first substrate after some micro LEDs were mounted according to an embodiment.
Figure 10A:
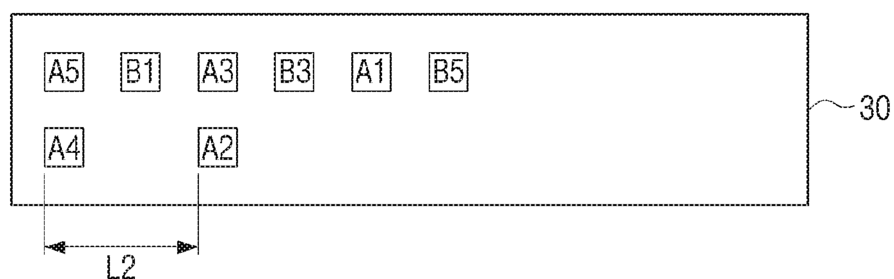
FIG. 10A is a top surface view of a second substrate illustrating a process wherein a plurality of additional micro LEDs are transferred on a second substrate according to an embodiment.
Figure 10B:
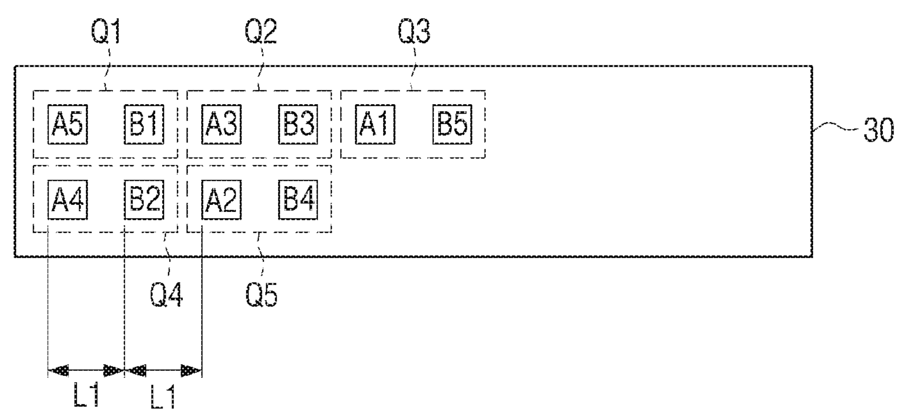
FIG. 10B is a top surface view of a second substrate illustrating a process wherein a plurality of additional micro LEDs are transferred on a second substrate according to an embodiment.

FIG. 9 is a bottom surface view illustrating the first substrate after some micro LEDs were mounted, and FIGS. 10A and 10B are top surface views of the second substrate 30 illustrating a process wherein a plurality of additional micro LEDs are transferred on the second substrate 30.

As illustrated in FIG. 9, a plurality of micro LEDs remain on the first substrate 20 after the A5-micro LED, the B1-micro LED, the A3-micro LED, the B3-micro LED, the A1-micro LED, and the B5-micro LED were transferred to the second substrate 30.

Next, the second substrate 30 may move in a horizontal direction on the stage 40. Accordingly, as illustrated in FIG. 10A, on the second substrate 30, the A4-micro LED and the A2-micro LED which are the plurality of remaining micro LEDs may be arranged.

That is, as the second substrate 30 moves, on the second substrate 30, the plurality of remaining micro LEDs may be arranged in different columns and rows from the areas wherein the A5-micro LED, the B1-micro LED, the A3-micro LED, the B3-micro LED, the A1-micro LED, and the B5-micro LED that were transferred previously are arranged.

Accordingly, by using all of the plurality of micro LEDs 21 arranged on the first substrate 20 without leaving them or throwing them away, the manufacturing cost can be reduced effectively.

Afterwards, as illustrated in FIG. 10B, between the A4-micro LED and the A2-micro LED, the B2-micro LED and the B4-micro LED may be arranged, respectively.

Accordingly, the average values of the performance levels of specific areas Q4 to Q5 on the second substrate 30 may be uniform, and a plurality of chips having different performance levels from one another may be arranged while being distributed uniformly.

Hereafter, a transfer process according to another micro LED transferring method will be described with reference to FIGS. 11A and 11B.

Figure 11A:
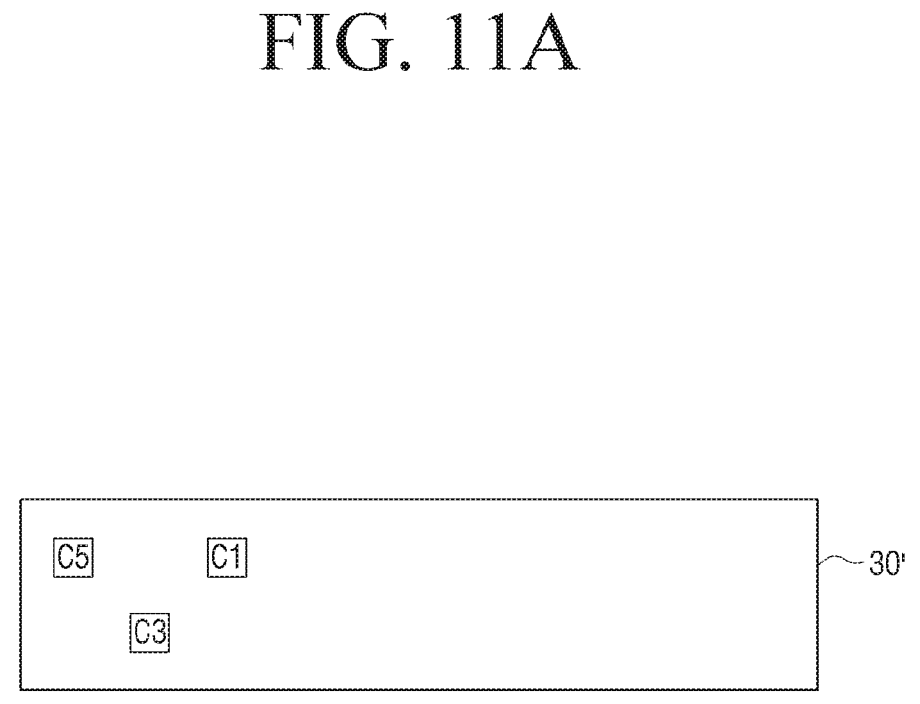

The processor 80 may selectively open the shutter 51 of the mask 50, and as illustrated in FIG. 11A, determine the first group micro LEDs 21*a*, and transfer the first group micro LEDs 21*a* on the second substrate 30'.

Here, the first group micro LEDs 21*a* may include the A5-micro LED, the C3-micro LED, and the C1-micro LED.

In addition, the first group micro LEDs 21*a* may be arranged in zigzags on the second substrate 30'.

Figure 11B:
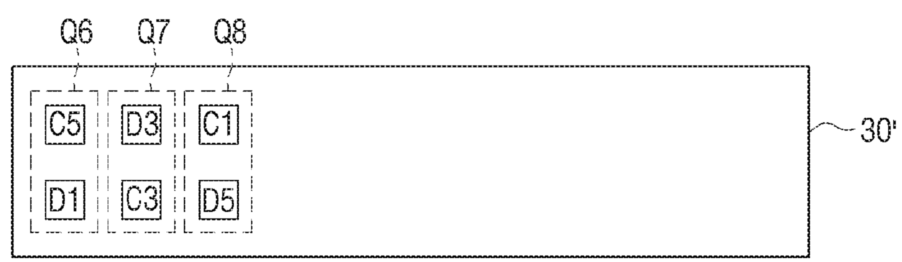

Afterwards, as illustrated in FIG. 11B, the processor 80 may determine the second group micro LEDs 21*b* that were not transferred, in the process wherein the first group micro LEDs 21*a* are transferred on the second substrate 30', and transfer the second group micro LEDs 21*b* on the second substrate 30'.

Here, the processor 80 may determine the arrangement locations and the arrangement interval in consideration of the characteristic information among the plurality of micro LEDs 21 transferred on the second substrate 30', as described above.

Accordingly, the average values of the performance levels in Q6 to Q8 which are random areas on the second substrate 30' may be uniform.

In addition, in the case of using the mask 50 which can selectively open and close the openings S, the plurality of micro LEDs 21 on the first substrate 20 can be selectively transferred, and thus transfer speed and transfer efficiency can be improved.

Hereinafter, a micro LED transferring method of the plurality of micro LEDs 21 using the micro LED transfer device 1 will be described in detail with reference to FIG. 12.

Figure 12:
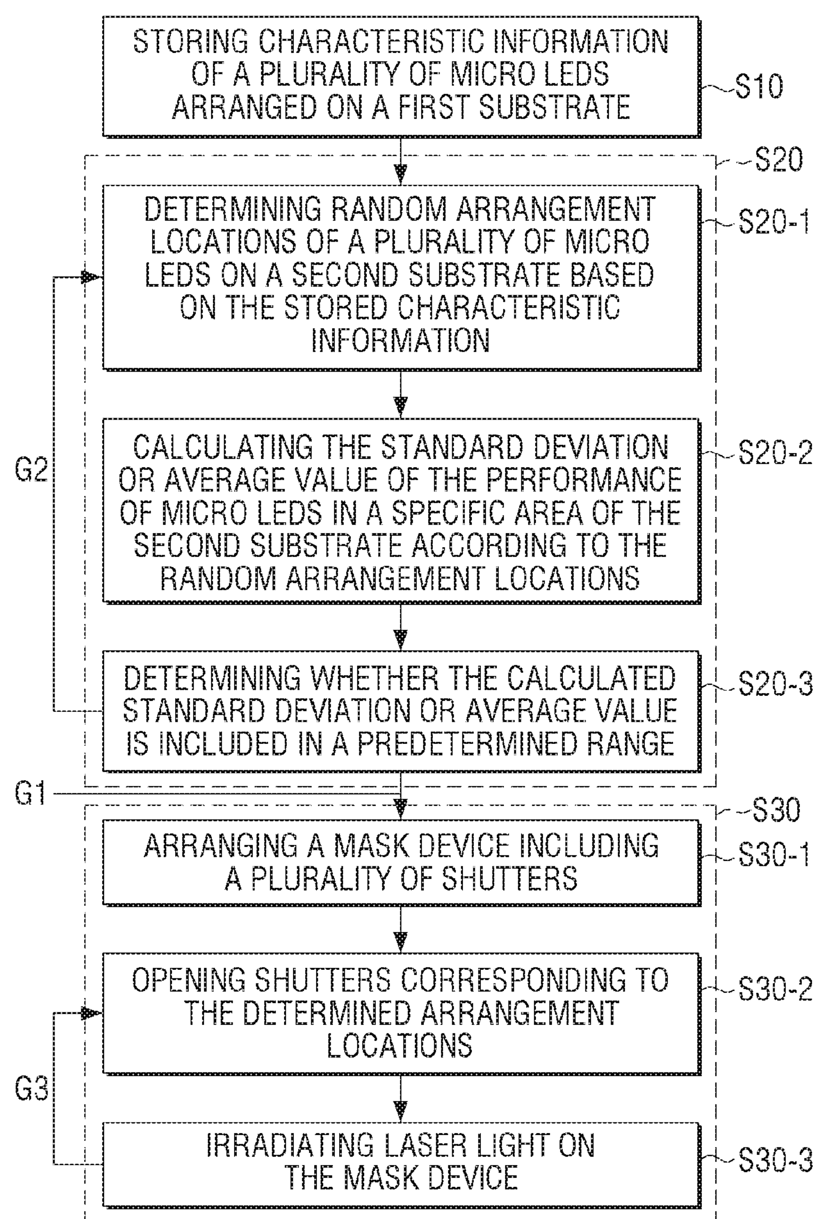
FIG. 12 is a flow chart illustrating a micro LED transferring method according to an embodiment.

FIG. 12 is a flow chart illustrating a micro LED transferring method according to an embodiment.

First, the characteristic information of the plurality of micro LEDs 21 arranged on the first substrate 20 is stored in the memory 70 at operation S10.

Afterwards, the processor 80 may determine the arrangement locations of the plurality of micro LEDs 21 on the second substrate 30 based on the characteristic information stored in the memory 70. Here, in determining the arrangement locations, the processor 80 executes simulation for determining the arrangement locations indicating the characteristics within a predetermined range at operation S20.

Specifically, based on the stored characteristic information, the processor 80 determines random arrangement locations of the plurality of micro LEDs 21 on the second substrate 30 at operation S20-1.

Afterwards, the processor 80 calculates the standard deviation or the average value of the performance of the micro LEDs 21 in a specific area on the second substrate 30 according to the random arrangement locations at operation S20-2.

Next, the processor 80 determines whether the calculated standard deviation or average value is included in a predetermined range at operation S20-3.

Here, in case the calculated standard deviation or average value is included in a predetermined range set by the user, the transferring step thereof S30 may proceed according to a G1 route.

In addition, in case the calculated standard deviation or average value exceeds a predetermined range set by the user, the processor 80 may determine new arrangement locations on the second substrate 30 based on the characteristic information stored in the memory 70 again, along a G2 route at operation S20.

Also, when the processor 80 determines new random arrangement locations, the processor 80 may make a determination with reference to the result of simulation with respect to the arrangement locations calculated previously.

Afterwards, the processor 80 may arrange the mask 50 including the plurality of shutters 51 on the first substrate 20 at operation S30-1.

Next, the processor 80 opens the shutters 51 corresponding to the determined arrangement locations at operation S30-2. Then, the processor 80 irradiates laser light L on the mask 50 at operation S30-3.

Accordingly, the plurality of micro LEDs 21 on the first substrate 20 according to the arrangement locations determined by the processor 80 may be irradiated on the second substrate 30.

Afterwards, through repetitive transferring steps S30-2, S30-3 through a G3 route, the plurality of micro LEDs 21 on the first substrate 20 may be arranged on the second substrate 30 while being distributed evenly.

Methods according to the aforementioned various embodiments may be implemented in the forms of applications that can be installed on conventional micro LED transfer devices.

Also, methods according to the aforementioned various embodiments may be implemented only with software upgrade, or hardware upgrade of conventional micro LED transfer devices.

In addition, the aforementioned various embodiments may be performed through an embedded server provided on a micro LED transfer device, or an external server of a micro LED transfer device.

The aforementioned various embodiments may be implemented in a recording medium that can be read by a computer or a device similar to a computer, by using software, hardware, or a combination thereof. In some cases, the embodiments described in this specification may be implemented as the processor 80 itself. According to implementation by software, the embodiments such as procedures and functions described in this specification may be implemented as separate software modules. Each of the software modules may perform one or more functions and operations described in this specification.

Computer instructions for performing processing operations of the micro LED transfer device 1 according to the aforementioned various embodiments may be stored in a non-transitory computer-readable medium. When computer instructions stored in such a non-transitory computer-readable medium are executed by the processor of a specific device, processing operations at the micro LED transfer device 1 according to the aforementioned various embodiments are performed by the specific device.

A non-transitory computer-readable medium refers to a medium that stores data semi-permanently, and is readable by machines, but not a medium that stores data for a short moment such as a register, a cache, and a memory. As specific examples of a non-transitory computer-readable medium, there may be a CD, a DVD, a hard disc, a blue-ray disc, a USB, a memory card, a ROM and the like.

Also, while the various embodiments have been described separately from one another, the embodiments do not have to be implemented independently, but the configuration and operation of each embodiment may be implemented in combination with at least one other embodiment.

In addition, while embodiments have been shown and described, the disclosure is not limited to the aforementioned specific embodiments, and it is apparent that various modifications can be made by those having ordinary skill in the technical field to which the disclosure belongs, without departing from the gist as claimed by the appended claims. Also, it is intended that such modifications are not to be interpreted independently from the technical idea or prospect.

What is claimed is:

1. A light emitting diode (LED) transfer device comprising:

a transfer part configured to arrange a first substrate wherein a plurality of LEDs are disposed on a lower surface relative to an upper surface of a second substrate;

a memory storing characteristic information of each of the plurality of LEDs;

a laser light source configured to irradiate laser light;

a mask comprising a plurality of shutters configured to selectively open and close a plurality of openings of the mask, the mask being interposed between the first substrate and the laser light source; and a processor configured to identify an LED from among the plurality of LEDs to be arranged on the second substrate based on the stored characteristic information, and control the mask such that a shutter from among the plurality of shutters that corresponds to the LED is opened.

2. The LED transfer device of claim 1, wherein the processor is further configured to:

identify a plurality of areas of the second substrate, and identify an arrangement location of each of the plurality of LEDs on the second substrate such that output characteristics among the plurality of areas constituting the second substrate are uniform.

3. The LED transfer device of claim 2, wherein the processor is further configured to identify a first group of LEDs from among the plurality of LEDs to be arranged on the second substrate and a second group of LEDs from among the plurality of LEDs to be arranged between the first group of LEDs on the second substrate.

4. The LED transfer device of claim 3, wherein the first group LEDs consisting of a plurality of LEDs arranged in locations wherein the plurality of openings are opened are simultaneously mounted on the second substrate.

5. The LED transfer device of claim 1, wherein the second substrate is arranged on a stage and is moveable in a horizontal direction.

6. The LED transfer device of claim 1, wherein the characteristic information of the plurality of LEDs indicates at least one from among an output wavelength, luminance, or a performance level.

7. The LED transfer device of claim 1, wherein each of the plurality of shutters is a micro electro mechanical system (MEMS).

8. The LED transfer device of claim 1, further comprising an adhesive layer interposed between each of the plurality of LEDs and the first substrate, and wherein the laser light is configured to generate heat in the adhesive layer to detach the plurality of LEDs from the first substrate.

9. A light emitting diode (LED) transferring method comprising:

storing characteristic information of a plurality of LEDs disposed on a first substrate;

identifying arrangement locations of the plurality of LEDs on a second substrate based on the stored characteristic information;

arranging a mask including a plurality of shutters between the first substrate and a laser light source, each of the plurality of shutters being configured to selectively open and close;

opening shutters corresponding to the plurality of LEDs of which arrangement locations on the second substrate were determined;

closing at least one of the plurality of shutters based on the stored characteristic information; and irradiating laser light on the mask.

10. The LED transferring method of claim 9, further comprising simultaneously mounting the first group of LEDs irradiated with the laser light on the second substrate.

11. The LED transferring method of claim 10, further comprising moving the second substrate in a horizontal direction after the first group of LEDs is mounted.

12. The LED transferring method of claim 9, wherein the identifying the arrangement locations of the plurality of LEDs on the second substrate further comprises:

identifying a plurality of areas of the second substrate; and identifying the arrangement locations of the plurality of LEDs on the second substrate such that output characteristics among the plurality of areas constituting the second substrate are uniform.

13. The LED transferring method of claim 12, further comprising:

identifying first group of LEDs to be arranged on the second substrate and a second group of LEDs to be arranged between the first group of LEDs among the plurality of LEDs on the first substrate.

14. The LED transferring method of claim 9, wherein the characteristic information of the plurality of LEDs indicates at least one from among an output wavelength, luminance, or a performance level.

15. A non-transitory computer-readable recording medium including a program for executing a light emitting diode (LED) transferring method, wherein the LED transferring method comprises:

storing characteristic information of a plurality of LEDs disposed on a first substrate;

identifying arrangement locations of the plurality of LEDs on a second substrate based on the stored characteristic information;

arranging a mask including a plurality of shutters between the first substrate and a laser light source, each of the plurality of shutters being configured to selectively open and close;

selectively opening and closing shutters from among the plurality of shutters that correspond to the plurality of LEDs disposed at arrangement locations that correspond to the arrangement locations on the second substrate; and controlling the laser light source to irradiate laser light on the mask.

* * * * *